United States Patent
Chadha (10) Patent No.: US 12,537,464 B2
(45) Date of Patent: Jan. 27, 2026

(54) SUBSTRATE SUPPORT ASSEMBLY WITH DIELETRIC COOLING PLATE

(71) Applicant: Applied Materials, Inc., Santa Clara, CA (US)

(72) Inventor: Arvinder Manmohan Singh Chadha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 178 days.

(21) Appl. No.: 18/377,753

(22) Filed: Oct. 6, 2023

(65) Prior Publication Data

US 2025/0119076 A1    Apr. 10, 2025

(51) Int. Cl.
*H01T 23/00* (2006.01)
*H02N 13/00* (2006.01)
*H05K 7/20* (2006.01)
*H01L 21/683* (2006.01)

(52) U.S. Cl.
CPC ......... *H02N 13/00* (2013.01); *H05K 7/20009* (2013.01); *H01L 21/6833* (2013.01)

(58) Field of Classification Search
None
See application file for complete search history.

(56) References Cited

U.S. PATENT DOCUMENTS

| | | | |
|---|---|---|---|
| 5,119,175 A | 6/1992 | Long et al. |
| 5,684,380 A | 11/1997 | Woody et al. |
| 6,081,414 A | 6/2000 | Flanigan et al. |
| 6,853,533 B2 | 2/2005 | Parkhe |
| 7,480,129 B2 | 1/2009 | Brown et al. |
| 7,589,950 B2 | 9/2009 | Parkhe et al. |
| 8,390,980 B2 | 3/2013 | Sansoni et al. |
| 8,633,423 B2 | 1/2014 | Lin et al. |
| 9,275,887 B2 | 3/2016 | Matyushkin et al. |
| 9,520,315 B2 | 12/2016 | Parkhe et al. |
| 9,622,375 B2 | 4/2017 | Busche et al. |
| 10,008,399 B2 | 6/2018 | Parkhe |
| 10,008,404 B2 | 6/2018 | Parkhe |
| 10,079,165 B2 | 9/2018 | Parkhe et al. |
| 10,186,444 B2 | 1/2019 | Kim et al. |
| 10,236,194 B2 | 3/2019 | Kim et al. |
| 10,410,900 B2 | 9/2019 | Huang et al. |
| 10,490,435 B2 | 11/2019 | Willwerth et al. |
| 2002/0050246 A1 | 5/2002 | Parkhe |
| 2008/0173237 A1 | 7/2008 | Collins et al. |
| 2014/0319121 A1 | 10/2014 | Kim et al. |

(Continued)

FOREIGN PATENT DOCUMENTS

| EP | 1098354 A2 | 5/2001 |
|---|---|---|
| JP | 2008118052 A | 5/2008 |

OTHER PUBLICATIONS

International Search Report and Written Opinion for International Application No. PCT/US2024/011689, mailed Jul. 2, 2024, 10 Pages.

*Primary Examiner* — Stephen W Jackson
(74) *Attorney, Agent, or Firm* — Lowenstein Sandler LLP (57) ABSTRACT

A substrate support assembly includes a first puck plate including one or more first functional elements, and a dielectric cooling plate is bonded to the first puck plate. The dielectric cooling plate includes one or more first channels for a coolant to flow therethrough, and one or more second channels for a gas to flow therethrough.

26 Claims, 7 Drawing Sheets

(56) References Cited

U.S. PATENT DOCUMENTS

| | | |
|---|---|---|
| 2015/0340255 A1 | 11/2015 | Parkhe et al. |
| 2017/0352566 A1 | 12/2017 | Ramaswamy et al. |
| 2018/0025931 A1 | 1/2018 | Nemani et al. |
| 2018/0337074 A1 | 11/2018 | Samir et al. |
| 2020/0411355 A1 | 12/2020 | Noorbakhsh et al. |
| 2021/0066107 A1 | 3/2021 | Zhang et al. |
| 2021/0159098 A1 | 5/2021 | Parkhe |
| 2025/0118586 A1* | 4/2025 | Chadha ............. H01L 21/68757 |
| 2025/0119076 A1* | 4/2025 | Chadha ............. H01L 21/68757 |

* cited by examiner

SUBSTRATE SUPPORT ASSEMBLY WITH DIELETRIC COOLING PLATE

TECHNICAL FIELD

Some embodiments of the present disclosure relate, in general, to a substrate support assembly having one or more puck plates and a dielectric cooling plate.

BACKGROUND

Electrostatic chucks are widely used to hold and secure substrates, such as semiconductor wafers, during various substrate processes like etching, deposition, and lithography. Electrostatic chucks typically include one or more electrodes embedded within a unitary chuck body which includes a dielectric or semi-conductive ceramic material across which an electrostatic clamping field can be generated to chuck a substrate. Heating elements may be included in the electrostatic chucks to heat a supported substrate.

Electrostatic chucks are traditionally formed from a single, monolithic, ceramic body that includes all of the functional elements of the electrostatic chuck or heater embedded within a single ceramic body. An organic bonding material is traditionally used to bond the ceramic body to a metal cooling plate, which limits power dissipation for high temperature processes such as etching. High temperatures or cryogenic temperatures may be used for high plasma power for etching or high surface temperatures may be needed to etch novel hard masks. High temperature etching may involve etching dielectric films including oxides, nitrides, or hafnium oxides; semi-conducting films including poly-Si, p-doped Si, n-doped Si, or Si; metal films including W, Cu, Al, Mo, or Ni; or combinations thereof. However, due to the use of an organic bonding material, current electrostatic chucks may not be suitable for high temperature applications.

Some conventional electrostatic chucks use metal cooling plates that may be coated with a dielectric using spray coating, anodization, or a combination thereof. However, the quality of the coating may degrade due to stress, fatigue, and/or creep that may result from thermal cycling and may eventually lead to arcing. Stresses within the electrostatic chuck may arise due to difference in the coefficients of thermal expansion of the materials used in forming the electrostatic chuck. Ceramics, for example, have a significantly lower coefficient of thermal expansion when compared to their metal counterparts, resulting in low subjectivity to expansion at high temperatures (e.g., greater than 150° C.).

SUMMARY

Some embodiments of the present disclosure described herein cover a substrate support assembly including a puck plate having one or more functional elements. The substrate support assembly also includes a dielectric cooling plate, which may be bonded to the puck plate. The dielectric cooling plate includes one or more channels for a coolant to flow therethrough, and one or more second channels for a gas to flow therethrough.

Some embodiments of the present disclosure described herein cover a method of forming a substrate support assembly. The method includes forming one or more first greens sheet for a puck plate. The one or more first green sheets include one or more embedded first functional elements. The method further includes forming one or more second green sheets for a dielectric cooling plate. The one or more second green sheets include one or more first channels for a coolant to flow therethrough and one or more second channels for a gas to flow therethrough. The method further includes disposing the one or more first green sheets on the one or more second green sheets and co-sintering the one or more first green sheets and the one or more second green sheets to form a substrate support assembly including the puck plate bonded to the dielectric cooling plate.

Some embodiments of the present disclosure described herein cover a method of forming a substrate support assembly. The method may include forming a puck plate including one or more functional elements. The method further includes forming a dielectric cooling plate with one or more channels. The method further includes at least partially bonding the puck plate to the dielectric cooling plate.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present disclosure provide a substrate support assembly that is able to support high temperature (e.g., greater than 150° C.) applications as well as low temperature (e.g., lesser than −150° C.) applications. The substrate support assembly includes a ceramic puck plate and a ceramic cooling plate (also referred to as a dielectric cooling plate), which enhances power dissipation for high temperature processes such as etching. Embodiments are also directed to a dielectric cooling plate usable in a substrate support assembly. The substrate support assembly may be used in processes where high plasma power may be used (e.g., dielectric film etching) or where high surface temperatures may be used to etch hard masks. Additionally, since both the puck plate and the cooling plate are made of a dielectric material (e.g., which may have the same or nearly the same coefficient of thermal expansion), the disclosed substrate support assemblies do not degrade, or minimally degrade, due to stress, fatigue, and/or creep that may result from thermal cycling.

In one embodiment, a substrate support assembly includes one or more puck plates including one or more functional elements. The functional elements may include a clamp electrode, a heating element, a zone heater, a pixelated heater, a radio frequency (RF) electrode, a RF filter, a gas channel, a cooling channel, or combinations thereof. In one embodiment, a puck plate may include one or more clamp electrodes, one or more peripheral RF electrodes, one or more heating elements, such as for a zone heater and/or a pixelated heater, and one or more RF electrodes. In some embodiments, the puck plate may include a RF filter to ensure that interference and noise are minimized, reducing any potential impact on the substrate. The substrate support assembly may further include a dielectric cooling plate including one or more cooling loops or channels to circulate a cooling fluid (e.g., a coolant or a refrigerant or gas) and absorb the heat from the puck plate. The dielectric cooling plate may also include one or more gas channels for a gas (e.g., inert gas) to flow therethrough. The ceramic puck plate and the dielectric cooling plate may be co-sintered together or they may be individually formed and then bonded together. The puck plate and the cooling plate can be bonded using a bonding layer including Ni, Ti, C, Si, a flexible graphite layer, an organic elastomer, Al, In, Ni, Ti, and/or an alloy including Ni—Ti or Mo—Mg, or Cu—Ag or Al alloy. Examples of materials that may be used in forming the puck plate and the cooling plate include niobium, aluminum oxide, aluminum nitride, single crystal alumina, or sapphire. In some embodiments, the puck plate and the dielectric cooling plate are bonded using a metal bond. In some embodiments, the puck plate and the dielectric cooling plate are bonded using a ceramic bond. In some embodiments, the puck plate and the dielectric cooling plate are bonded using a dielectric bond. The substrate support assembly including the puck plate and the cooling plate may be formed using a hot press, a hot isostatic press, a green sheet, a gel cast, or a sol gel process, for example. In some embodiments, the puck plate is an electrostatic chuck.

Embodiments of the present disclosure also provide a method for forming a substrate support assembly. The method includes forming one or more first green sheets for a puck plate. The one or more first green sheets include one or more embedded functional elements, which may include a clamp electrode, a heating element, a zone heater, a pixelated heater, a radio frequency (RF) electrode, a RF filter, a gas channel, a cooling channel, or combinations thereof. The method further includes forming one or more second green sheets for a dielectric cooling plate. The one or more second green sheets include one or more cooling loops or channels to circulate a cooling fluid (e.g., a coolant or a refrigerant or gas). The one or more second green sheets further include one or more channels for a gas (e.g., inert gas) to flow therethrough. The method further includes disposing the one or more first green sheets on the one or more second green sheets and co-sintering the one or more first green sheets and the one or more second green sheets to form a homogeneous substrate support assembly including the puck plate bonded to the dielectric cooling plate. Since the puck plate and the cooling plate are made of a dielectric material (e.g., having the same or nearly the same thermal coefficient of expansion), the disclosed substrate support assemblies formed as a result of the disclosed methods do not degrade due to stress, fatigue, and/or creep that may result from thermal cycling. The puck plate and the dielectric cooling plate may be formed of the same ceramic material, different ceramic materials, the same ceramic material with different purities, the same ceramic material with different grain sizes, different ceramic materials with different grain sizes, or different ceramic materials with different purities. Examples of materials that may be used in forming the puck plate and/or the cooling plate include niobium, aluminum oxide, aluminum nitride, single crystal alumina, or sapphire.

Embodiments of the present disclosure provide another method for forming a substrate support assembly. The method may include forming a ceramic puck plate including one or more functional elements. The puck plate may include one or more plates, and the functional elements may be disposed in one or more puck plates. The method further includes separately forming a dielectric cooling plate with one or more channels. The channels may be used to circulate a cooling fluid and/or a gas. The puck plate and the dielectric cooling plate may be separately formed via sintering, for example. The method further includes bonding the puck plate to the dielectric cooling plate using one or more bonding techniques. For example, the puck plate and dielectric cooling plate may be bonded organically (e.g., using one or more organic bonding layers), using a dielectric material, via diffusion bonding, by using a bonding layer that may be bonded to the puck plate, the cooling plate, and so on. In one embodiment, the dielectric cooling plate is bonded to the puck plate via a metal bond. In one embodiment, the dielectric cooling plate is bonded to the puck plate via a ceramic bond.

Figure 1:
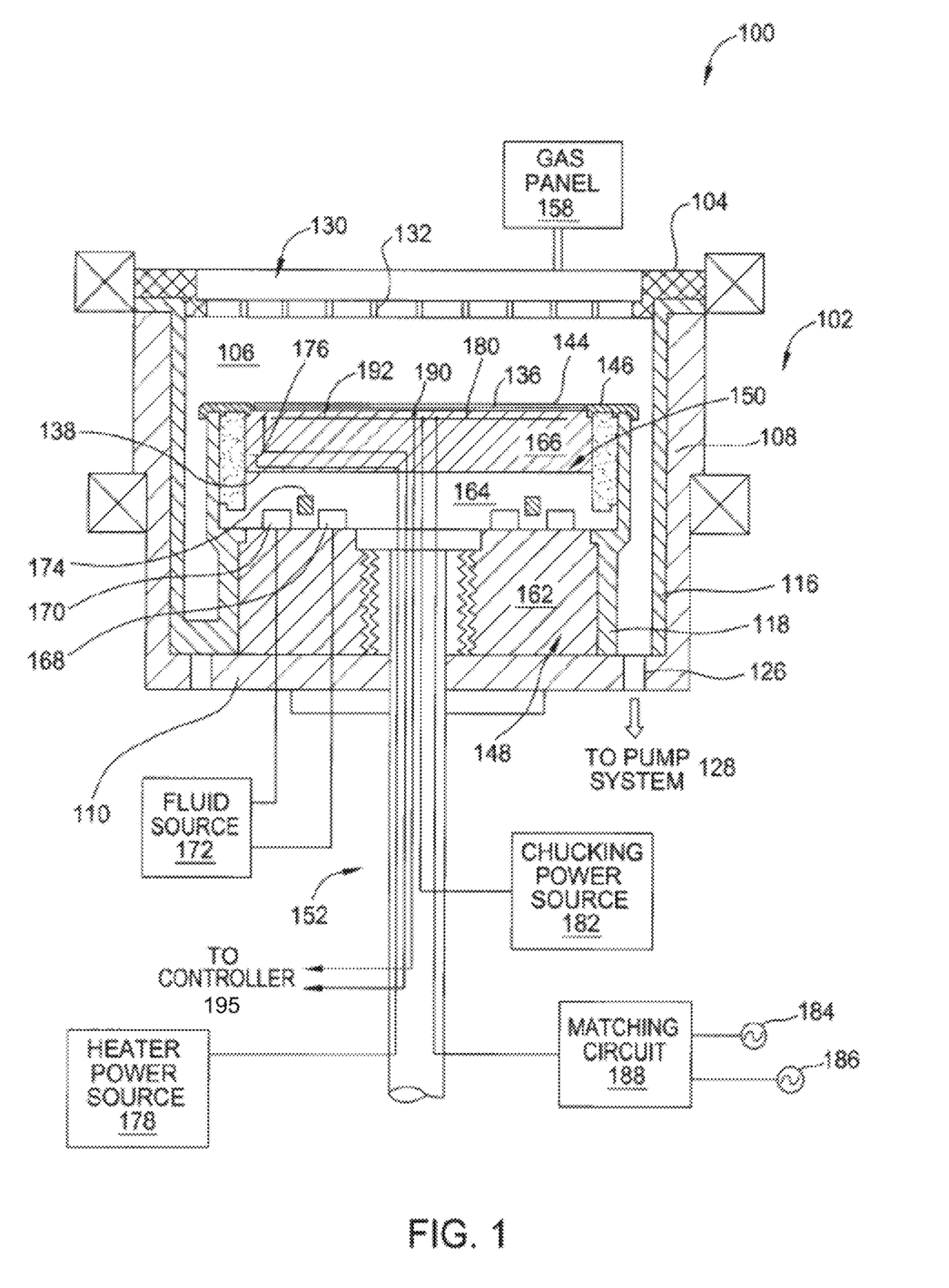
FIG. 1 depicts a sectional side view of one embodiment of a processing chamber.

FIG. 1 is a sectional view of one embodiment of a processing chamber 100 having a substrate support assembly 150 disposed therein. The processing chamber 100 may be any type of processing chamber, such as a deposition chamber, an etch chamber, an oxidation chamber, an implant chamber, and so on. While the substrate support assembly 150 is described as being an electrostatic chuck assembly or a heater assembly in some embodiments, the substrate support assembly may be replaced with other types of substrate support assemblies, such as a vacuum chuck assembly, a deposition heater assembly, and so on. In one embodiment, the substrate support assembly 150 includes a puck assembly 166 including one or more puck plates. The substrate support assembly 150 may additionally include two or more plates, where each plate may include zero or more different functional elements of the substrate support assembly (e.g., chucking electrodes, radiofrequency (RF) electrodes, main heating electrodes, auxiliary heating electrodes, cooling channels, and so on). The substrate support assembly 150 may further include a cooling plate 164, which may be formed from a dielectric material (e.g., a ceramic). The puck assembly 166 and the cooling plate 164 may be co-sintered, or they may be separately formed and then bonded together, as discussed in greater detail below. The puck assembly 166 can also be bonded to the cooling plate 164 by a bond such as a metal bond, an organic bond, a polymer bond, a ceramic bond, a diffusion bond, or combinations thereof.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 or nozzle that may be part of the lid 104. Examples of processing gases may be used to process in the processing chamber including halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of the substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, the substrate support assembly 150 is disposed in the interior volume 106 of the processing chamber 100 below the gas distribution assembly 130. The substrate support assembly 150 holds a substrate 144 during processing. An inner liner 118 may be coated on the periphery of the substrate support assembly 150. The inner liner 118 may be a halogen-containing gas resist material such as those discussed with reference to the outer liner 116. In one embodiment, the inner liner 118 may be fabricated from the same materials of the outer liner 116.

In one embodiment, the substrate support assembly 150 is part of a greater assembly 148 that includes the substrate support assembly 150 as well as a mounting plate 162 supporting a pedestal 152. In one embodiment, the substrate support assembly 150 includes a base (e.g., a thermally conductive base) referred to herein as a cooling plate 164 coupled to a puck assembly (also referred to as a puck plate assembly) 166. The cooling plate 164 may be a dielectric cooling plate, and may be coupled to the puck assembly 166 via diffusion bonding, using a dielectric material and/or by a bonding layer. The substrate support assembly 150 described in embodiments may be used for Johnsen-Rahbek and/or Coulombic electrostatic chucking in embodiments. The substrate support assembly 150 may additionally or alternatively be used as a heater, such as a deposition heater that is configured to heat a support substrate 144 during a deposition process.

In one embodiment, a protective ring 146 is disposed over a portion of the puck assembly 166 at an outer perimeter of the puck assembly 166. In one embodiment, the puck assembly 166 (or one or more plates of the puck assembly 166) is coated with a protective layer 136. Alternatively, the puck assembly 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), YAlO3 (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on. The protective layer may also be a ceramic composite such as $Y_3Al_5O_{12}$ distributed in $Al_2O_3$ matrix, $Y_2O_3$—$ZrO_2$ solid solution or a SiC—$Si_3N_4$ solid solution. The protective layer may also be a ceramic composite that includes a yttrium oxide (also known as yttria and $Y_2O_3$) containing solid solution. For example, the protective layer may be a ceramic composite that is composed of a compound $Y_4Al_2O_9$ (YAM) and a solid solution $Y_2$-$xZr_xO_3$ ($Y_2O_3$—$ZrO_2$ solid solution). Note that pure yttrium oxide as well as yttrium oxide containing solid solutions may be doped with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. Also note that pure Aluminum Nitride as well as doped Aluminum Nitride with one or more of $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides may be used. Alternatively, the protective layer may be sapphire or MgAlON.

In embodiments, the puck assembly 166 includes an upper puck plate (not shown) and a lower puck plate (not shown) bonded by a metal, ceramic, diffusion and/or organic bond. In some embodiments, the puck assembly 166 may include two or more plates. The puck assembly 166 and/or the cooling plate 164 may be formed from a monolithic dielectric or electrically insulative material (e.g., having an electrical resistivity of greater than $10^9$ Ohm·meter) that is usable for semiconductor processes at temperatures of 150° C. and above. In one embodiment, the puck assembly 166 and/or the cooling plate 164 is composed of materials usable from about 20° C. to about 500° C. In one embodiment, the puck assembly 166 and/or the cooling plate 164 is AlN or another ceramic. The puck assembly 166 and/or the cooling plate 164 may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the puck assembly 166 and/or the cooling plate 164 include $Al_2O_3$. The $Al_2O_3$ puck assembly 166 and/or the cooling plate 164 may be undoped or may be doped. For example, the $Al_2O_3$ may be doped with Titanium dioxide ($TiO_2$) or a transition metal oxide. In some embodiments, each of the puck assembly 166 and/or the cooling plate 164 may be formed of a same ceramic. In other embodiments, puck assembly 166 and/or the cooling plate 164 may formed of the same ceramic material, different ceramic materials, the same ceramic material with different purities, the same ceramic material with different grain sizes, different ceramic materials with different grain sizes, or different ceramic materials with different purities.

The puck assembly 166 may have a coefficient of thermal expansion that is matched or close to a coefficient of thermal expansion of the cooling plate 164. In one embodiment, the puck assembly 166 and/or the cooling plate 164 is a SiC porous body that is infiltrated with an AlSi alloy (referred to as AlSiSiC). The puck assembly 166 and/or the cooling plate 164 may alternatively be AlN or $Al_2O_3$ or other ceramic material or a combination thereof (e.g., aluminum oxynitride (ALON)). In one embodiment, the puck assembly 166 and/or the cooling plate 164 include undoped AlN or undoped $Al_2O_3$. In one embodiment, the puck assembly 166 is composed of the same material as the cooling plate 164. The AlSiSiC material, AlN or $Al_2O_3$ may be used, for example, in reactive etch environments or in inert environments.

In one embodiment, the puck assembly 166 and/or the cooling plate 164 is Molybdenum. Molybdenum may be used, for example, if the puck assembly 166 is to be used in an inert environment. Examples of inert environments include environments in which inert gases such as Ar, O2, N, etc. are flowed. Molybdenum may be used, for example, if the puck assembly 166 is to chuck a substrate for metal deposition. Molybdenum may also be used for the cooling plate 164 for applications in a corrosive environment (e.g., etch applications). In such an embodiment, exposed surfaces of the puck assembly 166 and/or the cooling plate 164 may be coated with a plasma resistant coating. The plasma coating may be performed via a plasma spray process. The plasma resistant coating may cover, for example, side walls of the cooling plate and an exposed horizontal step of the cooling plate. In one embodiment, the plasma resistant coating is $Al_2O_3$. Alternatively, the plasma resistant coating may be $Y_2O_3$ or a $Y_2O_3$ containing oxide. Alternatively, the plasma resistant coating may be any of the materials described with reference to protective layer 136.

The mounting plate 162 is coupled to the bottom 110 of the chamber body 102 and includes passages for routing utilities (e.g., fluids, power lines, sensor leads, etc.) to the cooling plate 164 and the puck assembly 166. The cooling plate 164 and/or puck assembly 166 may include one or more optional embedded heating elements 176, optional embedded thermal isolators 174 optional conduits 168, 170 to control a lateral temperature profile of the substrate support assembly 148, and/or other functional elements. In embodiments, different functions of the puck assembly 166 may be divided across multiple plates. For example, one plate may include RF electrodes, one plate may include primary heating electrodes, one plate may include auxiliary heating electrodes, and so on. In some embodiments, some or all functions are provided by a single plate. For example, one plate of puck assembly 166 may include RF electrodes, chucking electrodes, and/or heating electrodes.

In one embodiment, a thermal gasket 138 and/or o-ring is disposed on at least a portion of the cooling plate 164. For example, an o-ring may protect an interface between the cooling plate 164 and the puck assembly 166.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck assembly 166. The conduits 168, 170 and embedded heating elements 176 may be utilized to control the temperature of the puck assembly 166 for heating and/or cooling the puck assembly 166 and a substrate (e.g., a wafer) being processed. In one embodiment, the puck assembly 166 includes two separate heating zones that can maintain distinct temperatures. In another embodiment, the puck assembly 166 includes four or more different heating zones that can maintain distinct temperatures. The temperature of the puck assembly 166 and the thermally conductive base 164 may be monitored using multiple temperature sensors 190, 192, which may be monitored using a controller 195. The temperature sensors 190, 192 may be included in one plate of puck assembly 166 and/or in multiple plates of the puck assembly 166, which may be a same plate or plates or different plate or plates from the plate(s) containing the heating elements 176.

The puck assembly 166 may further include multiple gas passages such as grooves, mesas and other surface features that may be formed in an upper surface of a topmost plate of the puck assembly 166. The gas passages may be fluidly coupled to a source of a heat transfer (or backside) gas, such as He via holes drilled in the plates of the puck assembly 166. In operation, the backside gas may be provided at controlled pressure into the gas passages to enhance the heat transfer between the puck assembly 166 and the substrate 144.

In one embodiment, the puck assembly 166 includes at least one clamping electrode 180 controlled by a chucking power source 182. The clamping electrode 180 may be included in one plate of puck assembly 166. The clamping electrode 180 (also referred to as a chucking electrode) may further be coupled to one or more RF power sources 184, 186 through a matching circuit 188 for maintaining a plasma formed from process and/or other gases within the processing chamber 100. In one embodiment, a different RF electrode or set of electrodes are connected to one or more RF power sources 184, 186 and used for maintaining a plasma. The RF electrode(s) may be included in one plate of puck assembly 166. The one or more RF power sources 184, 186 may be capable of producing an RF signal having a frequency from about 40 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
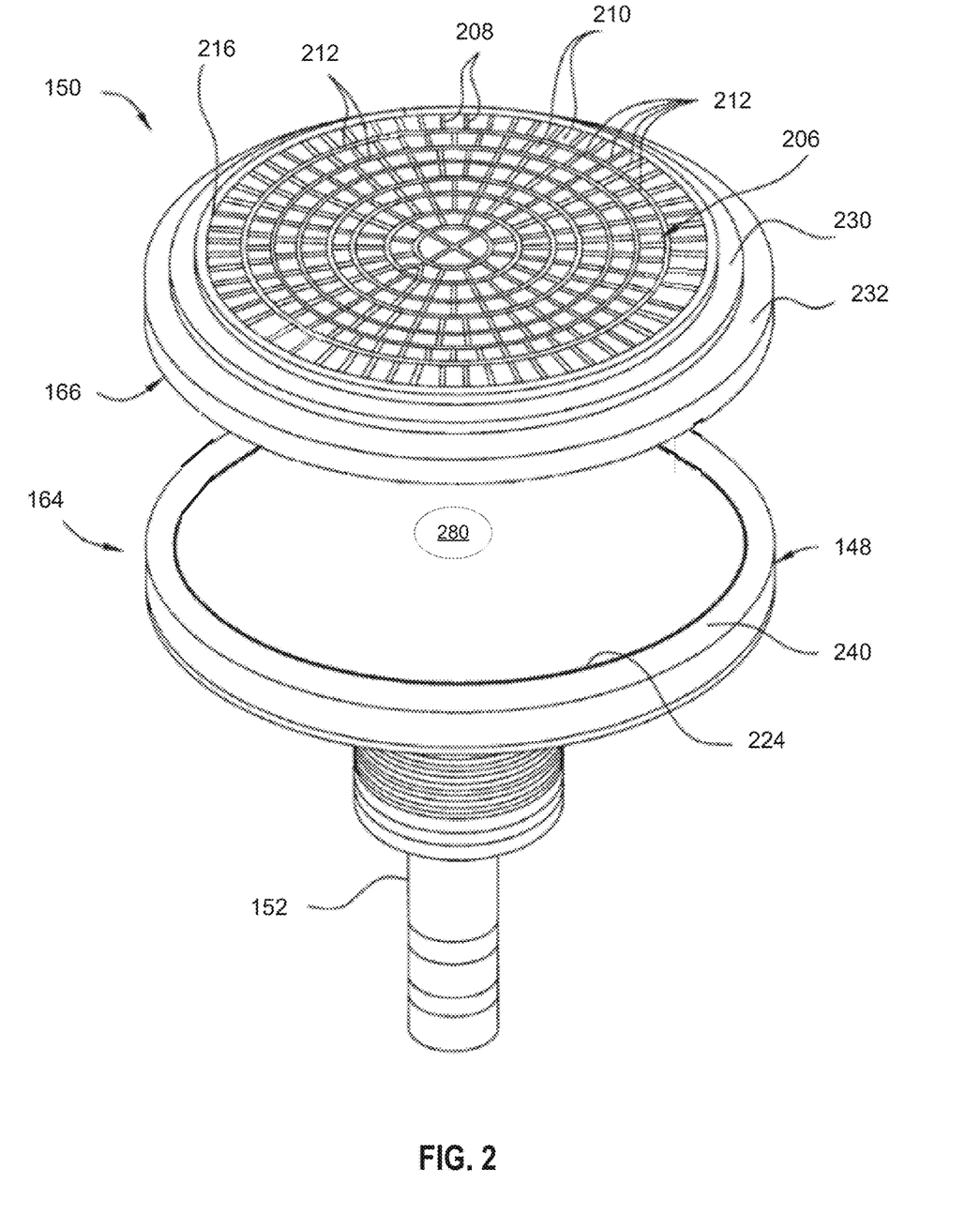
FIG. 2 depicts an exploded view of one embodiment of a substrate support assembly.

FIG. 2 depicts an exploded view of one embodiment of the substrate support assembly 150. The substrate support assembly 150 includes the puck assembly 166, the cooling plate 164, and the pedestal 152. In some embodiments, the cooling plate 164 may be attached to the puck assembly 166 by a bond. The interior volumes within the substrate support assembly 150 may include open spaces within the pedestal 152 for routing conduits and wiring.

In some embodiments, the puck assembly 166 and the dielectric cooling plate 164 may be co-sintered together or they may be individually formed and then bonded together (as shown). The puck assembly 166 and the dielectric cooling plate 164 can be bonded using a bonding layer including Ni, Ti, C, Si, a flexible graphite layer, an organic elastomer, Al, In, Ni, Ti, and/or an alloy including Ni—Ti or Mo—Mg, or Cu—Ag or Al alloy. In some embodiments, the puck assembly 166 and the dielectric cooling plate 164 are bonded via diffusion bonding. In some embodiments, the puck assembly 166 and the dielectric cooling plate 164 are bonded by a metal bond.

Examples of materials that may be used in forming the puck assembly 166 and/or the dielectric cooling plate 164 include niobium, aluminum oxide, aluminum nitride, single crystal alumina, or sapphire. The substrate support assembly 150 including the puck assembly 166 and the dielectric cooling plate 164 may be formed using a hot press, a hot isostatic press, one or more green sheet, a gel cast, or a sol gel process, for example.

The puck assembly 166 may include one or more embedded functional elements, which may include one or more clamp electrode, one or more heating element, one or more zone heater, one or more pixelated heater, one or more radio frequency (RF) electrode, one or more RF filter, one or more gas channel, one or more cooling channel, or combinations thereof. The cooling plate 164 may include one or more cooling loops or channels to circulate a cooling fluid (e.g., a coolant or a refrigerant or gas). The cooling plate 164 may further include one or more channels for a gas (e.g., inert gas) to flow therethrough.

Since the puck plate and the cooling plate are made of a dielectric material (e.g., which may have the same or nearly the same thermal coefficient of expansion), the substrate support assembly 150 may not degrade due to stress, fatigue, and/or creep that may result from thermal cycling. The puck assembly 166 and the dielectric cooling plate 164 may be formed of the same ceramic material, different ceramic materials, the same ceramic material with different purities, the same ceramic material with different grain sizes, different ceramic materials with different grain sizes, or different ceramic materials with different purities. Examples of materials that may be used in forming the puck assembly 166 and the cooling plate 164 include niobium, aluminum oxide, aluminum nitride, single crystal alumina, or sapphire.

In one embodiment, the puck assembly 166 has a disc-like shape having an annular periphery that may substantially match the shape and size of the substrate 144 positioned thereon. An upper surface of the puck assembly 166 may have an outer ring 216, multiple mesas 206, 210 and channels 208, 212 between the mesas 210. In one embodiment, the puck assembly 166 includes an upper plate region 230 having a first diameter and a lower plate region 232 having a second diameter that is greater than the first diameter.

In one embodiment, the puck assembly 166 is bonded to the cooling plate 164 by a metal bond, a ceramic bond, an organic bond, a polymer bond, or other type of bond. In one embodiment, the bond has different thermal conductivity in different directions. For example, the bond may have different thermal conductivity in the x, y and/or z directions. In some embodiments, the bond comprises a ceramic with metal fillers (e.g., having ellipsoid particles). The metal fillers may alter a thermal conductivity of the bond in a targeted direction. The thermal conductivity of the bond may accordingly be tailored in one or more directions or planes so that it has isotropic or anisotropic heat transfer properties. In one embodiment, the upper puck plate 230 may be fabricated by an electrically insulative ceramic material. Suitable examples of the ceramic materials include aluminum nitride (AlN), alumina ($Al_2O_3$), and the like.

In one embodiment, the material used for the cooling plate 164 may be suitably chosen so that a coefficient of thermal expansion (CTE) for the cooling plate 164 material substantially matches the CTE of the electrically insulative puck 166 material in order to minimize CTE mismatch and avoid thermo-mechanical stresses which may damage the puck 166 during thermal cycling. The cooling plate may be composed of a same material as the one or more plates of the puck 166, but may have a different purity level, a different grain size, different amounts of dopants, and so on to provide different material properties for the cooling plate 164 than the puck 166 in embodiments.

The cooling plate 164 attached below the puck assembly 166 may have a disc-like main portion 224 and an annular flange extending outwardly from the main portion 224 and positioned on the pedestal 152. In one embodiment, the cooling plate 164 may be fabricated by a ceramic such as AlN, $Al_2O_3$, a composite ceramic (such as an aluminum-silicon alloy infiltrated SiC or Molybdenum), etc., to match or approximately match a thermal expansion coefficient of the puck 166. The cooling plate 164 should provide good strength and durability as well as heat transfer properties.

Figure 3:
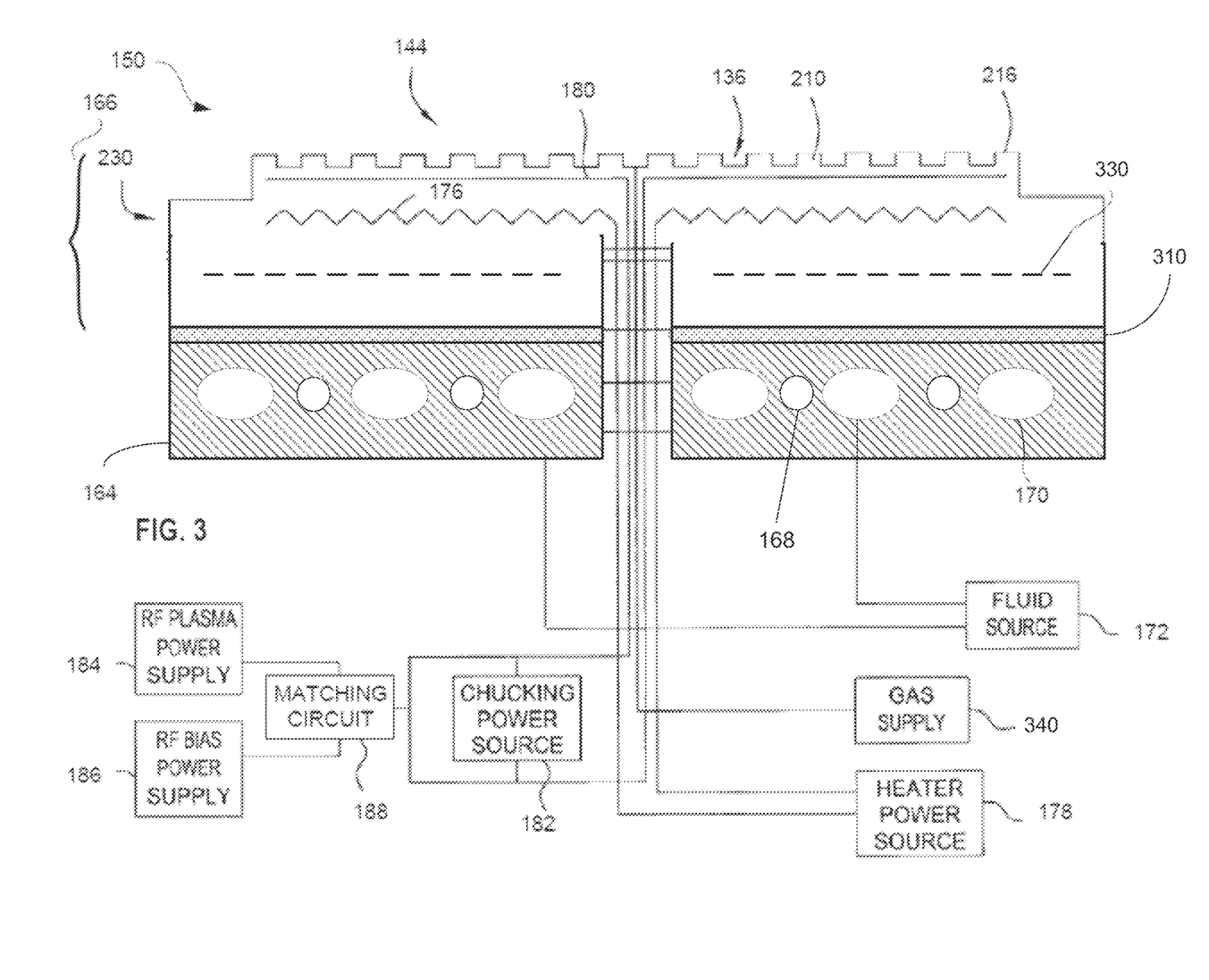
FIG. 3 depicts a sectional side view of one embodiment of a substrate support assembly.

FIG. 3 depicts a sectional side view of one embodiment of a substrate support assembly 150. The substrate support assembly 150 includes a puck assembly 166 including one or more puck plates 230, such as one plate, two plates, three plates, four plates, five plates, and so on. Different techniques may be used to bond the multiple plates together and/or to cooling plate 164. One technique that may be used for bonding is metal bonding. Polymer bonding, diffusion bonding, organic bonding, and so on may also be performed to bond plates together. In some embodiments, all plates are bonded using a same bonding technique. In some embodiments, different bonding techniques are used for different plates. In one embodiment, diffusion bonding is used as a method bonding plates of the substrate support assembly 150 together.

The puck plate 230 includes mesas 210, channels 212 and optionally an outer ring 216. In one embodiment, the puck plate 230 includes functional elements such as clamping electrodes 180, one or more heating elements 176, one or more fluid channels, and/or one or more RF electrodes 330. The fluid channels may have circular cross sections, rectangular cross sections, and/or cross sections with other shapes. The fluid channels may be used to provide a backside gas such as He to a backside of a supported substrate in embodiments. Alternatively, the clamping electrodes 180, heating elements 176, and RF electrodes 330 may be disposed in different plates. The clamping electrodes 180 may be coupled to a chucking power source 182, and/or to an RF plasma power supply 184 and/or an RF bias power supply 186 via a matching circuit 188. The puck plate 230 and/or cooling plate 164 may additionally include gas delivery holes (not shown) through which a gas supply 340 pumps a backside gas such as He. Additionally, the puck plate 230 and/or cooling plate 164 may additionally include one or more cooling holes (not shown) for a cooling fluid to flow therethrough.

The heating elements 176 are electrically connected to a heater power source 178 for heating the puck plate 230. The puck plate 230 may include electrically insulative materials such as AlN. The puck plate may include $Al_2O_3$. In one embodiment, the puck plate 230 is composed of a metal matrix composite material. In one aspect, the metal matrix composite material includes aluminum and silicon. In one embodiment, the metal matrix composite is a SiC porous body infiltrated with an AlSi alloy.

The puck plate 230 is coupled to and in thermal communication with cooling plate 164 having one or more conduits 170 (also referred to herein as cooling channels) in fluid communication with fluid source 172. Cooling plate 164 is a dielectric cooling plate, and is bonded to puck plate 230. In one embodiment, the cooling plate 164 is coupled to the puck assembly 166 using a dielectric material (e.g., a ceramic layer) 310. In some embodiments, a bond is used to secure puck assembly 166 to cooling plate 164. In some embodiment, a metal bond, an organic bond, a polymer bond, a ceramic bond, a diffusion bond, or another type of bond is used to bond puck plate 230 to cooling plate 164.

In some embodiments, an o-ring or gasket is not used between puck assembly 166 and cooling plate 164. Alternatively, an o-ring or gasket may be used. In some embodiments, a separation between puck assembly 166 and cooling plate 164 minimizes the contact area between the puck assembly 166 and the cooling plate 164.

In some embodiments, the puck assembly 166 and the cooling plate 164 are not bonded together. In such embodiments, fasteners may be used to couple the puck assembly 166 and the cooling plate 164 together. For example, puck assembly 166 and/or cooling plate 164 may each include features for accommodating a threaded insert and/or a head of a threaded fastener. The threaded fastener may then extend between the puck assembly 166 and the cooling plate 164 and be tightened against the threaded insert in the cooling plate or puck plate.

In one embodiment (not shown), a grafoil layer or other flexible graphite layer is disposed between the puck assembly 166 and the cooling plate 164. The flexible graphite may have a thickness of about 10-40 mil. The flexible graphite may be thermally conductive, and may improve a heat transfer between the puck assembly 166 and the cooling plate 164.

In one embodiment (not shown), the cooling plate 164 includes a base portion. In one embodiment, the cooling plate 164 includes a spring loaded inner heat sink connected to the base portion by one or more springs. The springs apply a force to press the inner heat sink against the puck 166. A surface of the heat sink may have a predetermined roughness and/or surface features (e.g., mesas) that control heat transfer properties between the puck 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

Figure 4A:
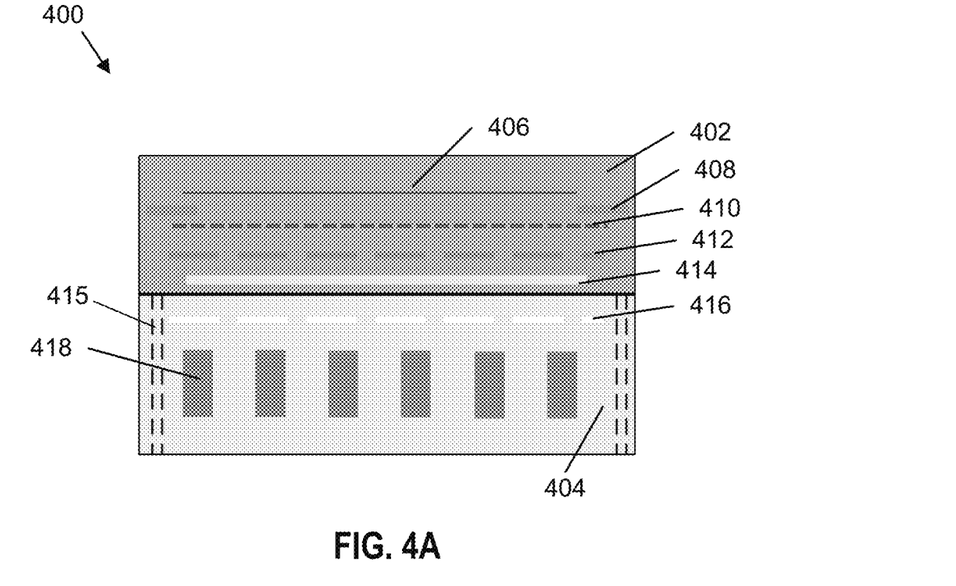
FIGS. 4A-4D depict sectional side views of embodiments of a substrate support assembly.

FIG. 4A depicts a cross-sectional view of a substrate support assembly 400, according to one embodiment. The substrate support assembly 400 may include one or more puck plates 402, which may include one or more functional elements. The functional elements may include a clamp electrode, a heating element, a zone heater, a pixelated heater, a radio frequency (RF) electrode, a RF filter, a gas channel, a cooling channel, or combinations thereof. In some embodiments, the puck plate 402 may include one or more chucking electrodes 406 for creating an electrostatic force that holds the substrate or wafer in place during processing in the chamber. In some embodiments, the puck plate 402 may include RF electrodes 408, 414 to ensure that interference and noise are minimized, reducing any potential impact on the substrate or wafer. In some embodiments, the RF electrodes 408 may be formed along a circumference of the puck plate 402. In some embodiments, the RF electrodes 414 may be centrally placed and may cover a portion or an entire area of the puck plate 402.

In some embodiments, the puck plate 402 may include heating electrodes 410 that may cover a portion or an entire area of the puck plate 402. In some embodiments, the puck plate 402 may include zone heaters 412, which may each cover only a portion of the area of the puck plate 402. The puck plate 402 may include two, three, or four such zone heaters in the same place or in different planes. Similarly, the chucking electrodes 406, RF electrodes 408, 414, and heaters 410, 412 may be disposed in the same plane or different planes of the puck plate 402. In some embodiments, the number of zone heaters 412 may correspond to the number of RF electrodes 414. For example, if there are four zone heaters 412 in the puck plate 402, then there may be four RF electrodes 414 corresponding to the four zone heaters 412, and vice versa. Each of the functional elements 406-414 may be connected to a power source (not shown) via terminals that may be routed to the top and/or bottom of the substrate support assembly 150.

The substrate support assembly 400 may further include a dielectric cooling plate 404 including one or more cooling loops or channels 418 to circulate a cooling fluid (e.g., a coolant or a refrigerant or gas) and absorb the heat from the puck plate 402. The dielectric cooling plate 404 may also include one or more gas channels 416 for a gas (e.g., inert gas) to flow therethrough. The gas channels 416 may be fluidly coupled to a source of a heat transfer (or backside) gas, such as He, via holes drilled in the puck plate 402. In operation, the backside gas may be provided at controlled pressure into the gas channels 416 to enhance the heat transfer between the puck plate 402 and the substrate. Although the cooling channels 418 and gas channels 416 are illustrated to be rectangular in FIG. 4, the cooling channels 418 and gas channels 416 may have any shape (e.g., a cross section of any shape) such as a square, a rectangle, a circle, an oval, a fin shape, a computer generated shape, a porous shape, or combinations thereof. In some embodiments, a dimension of the cooling channels 418 and/or the gas channels 416 may be determined based on a thermal conductivity of the dielectric material forming the cooling plate 404. For example, if the thermal conductivity is low, the cooling plate may have larger cooling channels 418 and/or gas channels 416. In another example, if the thermal conductivity of the material is high, the cooling plate may have smaller cooling channels 418 and/or gas channels 416. In some embodiments, the cooling plate 404 may further include one or more terminals, which may be used to connect one or more functional elements in puck plate 402 to a power source. In some embodiments, the cooling plate 404 further includes one or more vias 415 for the terminals to pass therethrough. In some embodiments, the cooling plate 404 may include both the vias 415 and the terminals to connect one or more functional elements in puck plate 402 to a power source.

In some embodiments, the ceramic puck plate 402 and the dielectric cooling plate 404 may be co-sintered together, which may cause a diffusion bond between the ceramic puck plate 402 and the dielectric cooling plate 402. In some embodiments, the ceramic puck plate 402 and the dielectric cooling plate 404 may be individually formed (e.g., separately sintered) and then bonded together. In some embodiments, the puck plate 402 may be bonded to the cooling plate 404 using diffusion bonding, ceramic frit, or glass frit. In some embodiments, the puck plate 402 and cooling plate 404 are bonded using a metal bond. In some embodiments, the puck plate 402 and the cooling plate 404 can be bonded using a bonding layer (not shown) including Ni, Ti, C, Si, a flexible graphite layer, an organic elastomer, Al, In, Ni, Ti, and/or an alloy including Ni—Ti or Mo—Mg, or Cu—Ag or Al alloy. In some embodiments, the puck plate 402 and the cooling plate 404 may be bonded using another dielectric material (e.g., ceramic) as a bonding layer. Examples of materials that may be used in forming the puck plate 402, the cooling plate 404, and the bonding layer include niobium, aluminum oxide, aluminum nitride, single crystal alumina, or sapphire. In some embodiments, the substrate support assembly 400 including the puck plate 402 and the cooling plate 404 may be formed using a hot press, a hot isostatic press, one or more green sheet, a gel cast, or a sol gel process, for example.

Figure 4B:
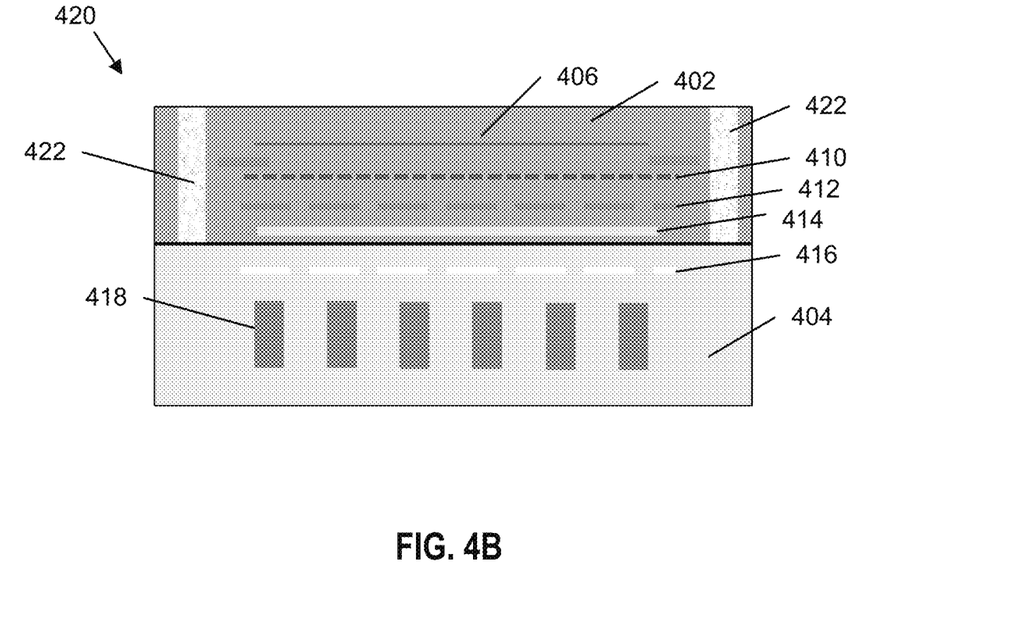

FIG. 4B depicts a cross-sectional view of a substrate support assembly 420, according to one embodiment. In this embodiment, in addition to the gas channels 416 in cooling plate 404, the puck plate 402 may include one or more porous plugs 422, which may be formed from a porous material (e.g., a ceramic material with pores). Porous plugs 422 may serve as gas channels that may be used to separate the substrate or wafer (not shown) from the substrate support assembly 420. The porous plugs may have a porous body comprising a plurality of pores within the porous body, the plurality of pores each comprising pore walls. The porous body is permeable to a gas. In one embodiment, the porous plug is a ceramic porous plug. In some embodiments, the ceramic porous plug may be composed of a two phase material comprising sintered particles of a first oxide and a second oxide that acts as a binder for the sintered particles of the first oxide. The two phase material may be arranged in a porous matrix. The first oxide may be $Al_2O_3$ or AlN, and the second oxide may be $SiO_2$, for example. In some embodiments, the porous plug is coated with a corrosion resistant coating (e.g., by atomic layer deposition). The coating may coat walls of pores of the porous plug.

The porous plugs 422 may have a porous portion, or the entire porous plug 422 may be porous. The porosity may vary from 10% to 90%. In some embodiments, the porosity of the porous plugs 422 may vary from 30% to 70%. In some embodiments, the porosity of the porous plugs 422 may vary from 40% to 60%. In some embodiments, the porous plugs 422 may be formed from a different material than the puck plate 402. In some embodiments, the porous plugs 422 may be formed from the same material as the puck plate 402.

Figure 4C:
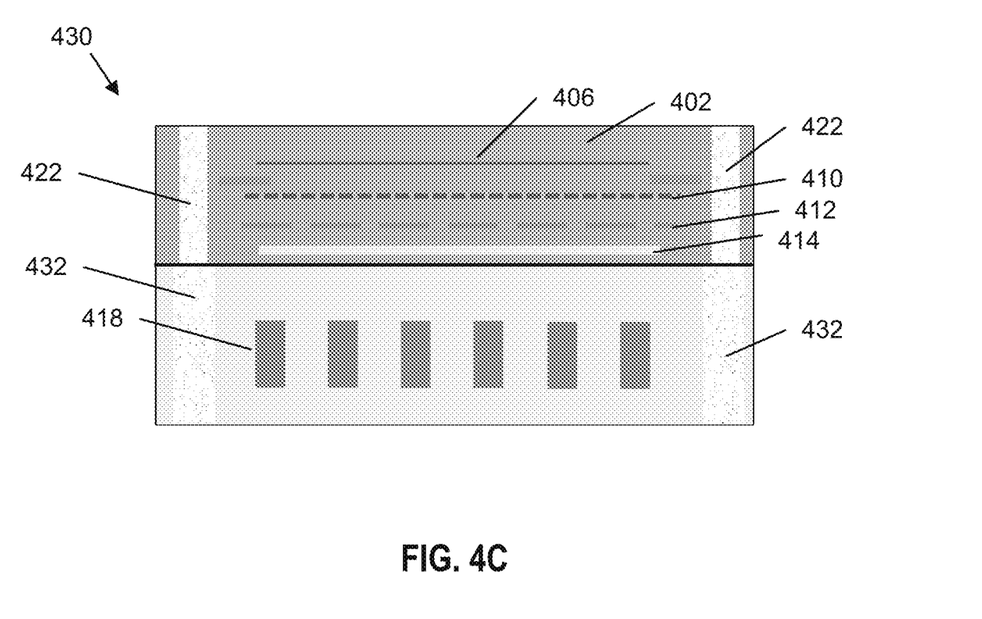

FIG. 4C depicts a cross-sectional view of a substrate support assembly 430, according to one embodiment. In this embodiment, one or more gas channels 416 in the cooling plate 404 may be replaced by one or more porous plugs 432, or porous plugs 432 may be provided in addition to the embedded gas channels 416. Porous plugs 432 may be used to direct inert gases, such as He, towards the substrate or wafer (not shown) in a cooling phase. Porous plugs 432 may have a porous portion, or the entire porous plug 432 may be porous. The porosity may vary from 10% to 90%. In some embodiments, the porosity of the porous plugs 432 may vary from 30% to 70%. In some embodiments, the porosity of the porous plugs 432 may vary from 40% to 60%. In some embodiments, the porous plugs 432 may be formed from a different material than the cooling plate 404. In some embodiments, the porous plugs 432 may be formed from the same material as the cooling plate 404. In some embodiments, the porous plugs 432 may be formed from a different material than the porous plugs 422. In some embodiments, the porous plugs 432 may be formed from the same material as porous plugs 422. In some embodiments, porous plugs 432 and porous plugs 422 may include the same material with different purities, the same material with different grain sizes, different ceramic materials with different purities, different ceramic materials with different grain sizes, or combinations thereof.

Figure 4D:
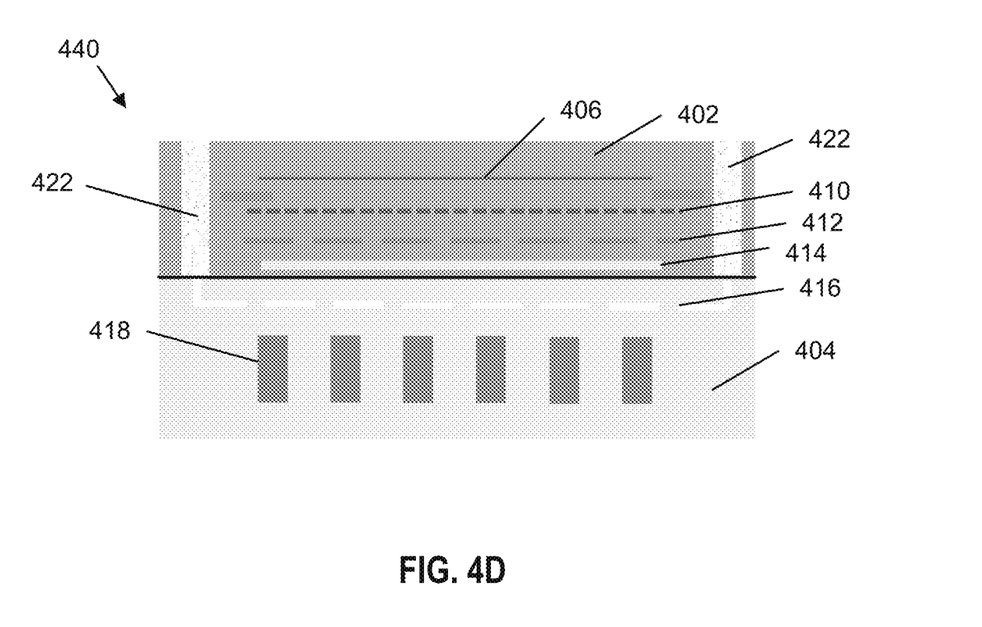

FIG. 4D depicts a cross-sectional view of a substrate support assembly 440, according to one embodiment. In this embodiment, gas channels 416 may be directly or indirectly connected to porous plugs 422. Porous plugs 422 may be used to direct inert gases, such as He, towards the substrate or wafer (not shown) in a cooling phase. Porous plugs 422 may have a porous portion, or the entire porous plug 422 may be made porous.

Figure 5:
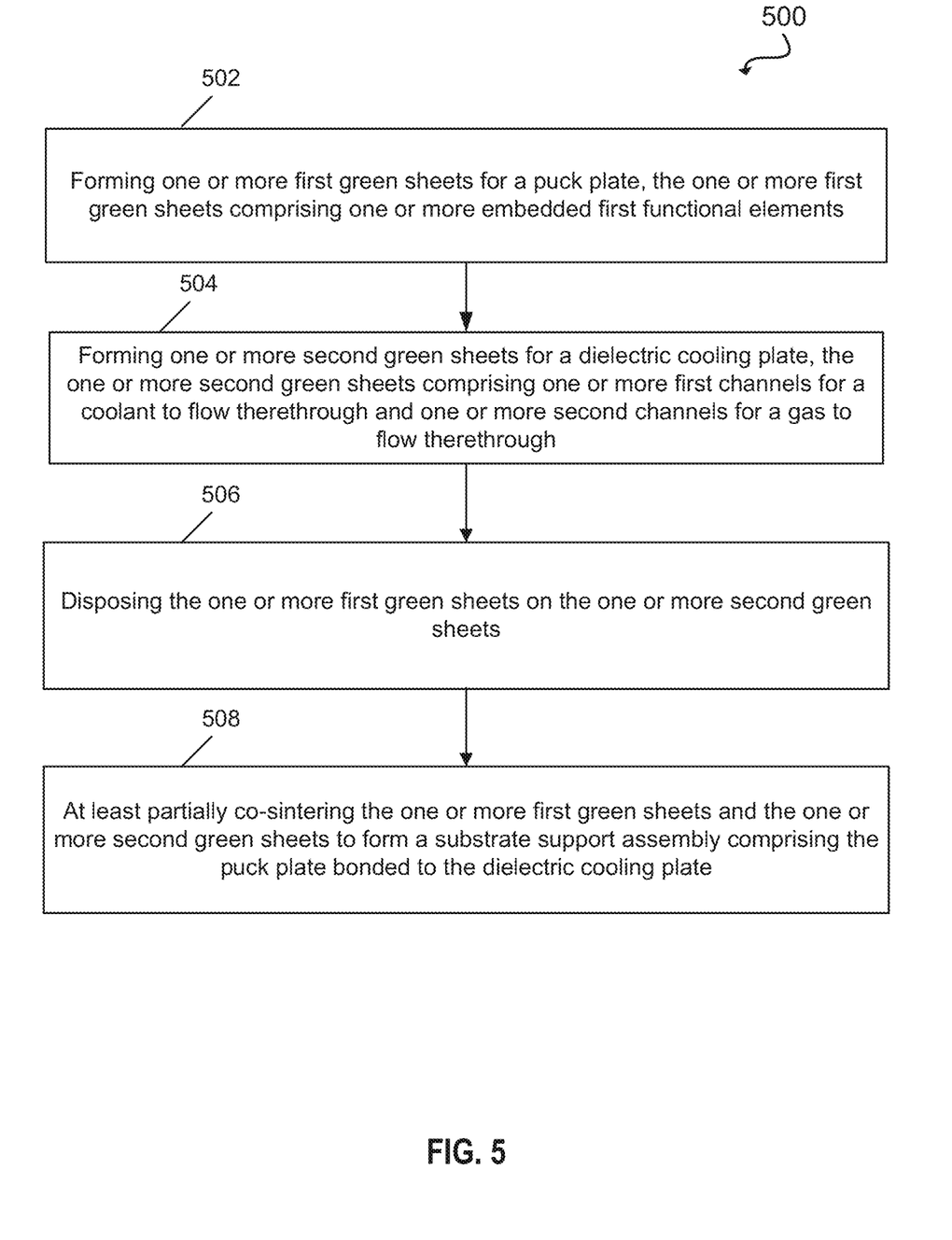
FIG. 5 illustrates one embodiment of a method of forming a substrate support assembly.

FIG. 5 illustrates example operations in a method 500 of forming a substrate support assembly, according to some embodiments. At block 502, one or more first green sheets may be formed for a puck plate (e.g., puck plate 402). For example, one green sheet or a combination of green sheets may form a functional element. In another example, a heating element (e.g., heating electrodes 410, 412) may use one green sheet, and the vias (e.g., vias 415) to make electrical connections or the gas channels may use two or more green sheets. A "green sheet" may refer to a ceramic material in an early stage of processing. A green sheet may be thin and/or flat, and serve as the base material for creating one or more components of an electrostatic chuck. A green sheet may be unfired or uncured, and may be in a malleable or semi-malleable state.

At block 502, method 500 may involve creating the green sheet (or first stack of green sheets) from a ceramic material (e.g., $Al_2O_3$ or a similar material). The green sheet(s) may include a mixture of ceramic powders, binders, plasticizers and/or solvents in embodiments. The green sheet(s) may be formed by pressing and shaping a ceramic powder into a flat sheet. The green sheet(s) may be processed further to add specific patterns, features, and/or electrode layers using techniques like screen printing or laser machining. For example, at block 502, one or more functional elements (e.g., 406-414) may be embedded in the first green sheet(s). In some embodiments, multiple layers of green sheets are stacked on each other, with one or more electrodes, features, etc. formed in one or more of the layers and/or between one or more layers.

At block 504, a second green sheet (or second stack of green sheets) may be formed for the cooling plate (e.g., cooling plate 404). The second green sheets may be configured to include one or more cooling channels (e.g., channels 416) for a coolant (e.g., refrigerant) to flow therethrough. The second green sheet(s) may be further configured to include one or more gas channels (e.g., channels 418) for a gas (e.g., inert gas) to flow therethrough. In some embodiments, multiple layers of green sheets are stacked on each other, with one or more channels, features, etc. formed in one or more of the layers and/or between one or more layers.

At block 506, the first green sheet(s) and the second green sheet(s) with the target patterns and features (e.g., functional elements) may be stacked and laminated together to create a final structure for the substrate support assembly. At block 508, the stacked green sheets may be subjected to a high-temperature sintering process (e.g., co-sintering) to fuse the ceramic particles together, and form a solid and rigid structure. For example, the first green sheet(s) and the second green sheet(s) may be co-sintered to form a substrate support assembly including the puck plate completely bonded to the dielectric cooling plate. In some embodiments, the cooling plate and puck plate (e.g., electrostatic chuck) are two components of a single monolithic plate that comprises the functionality of both a cooling plate and an electrostatic chuck.

In some embodiments, the green sheet assembly may be formed with one or more porous plugs (e.g., porous plugs 422, 432). In some embodiments, the porous plugs may be separately formed and inserted into the green sheet assembly to be co-sintered with the green sheet assembly to form the substrate support assembly. In some embodiments, the green sheet assembly may be partially sintered prior to the porous plugs being inserted. The partially sintered green sheet assembly along with the inserted porous plugs may be co-sintered to form the substrate support assembly. In some embodiments, the porous plugs may be partially sintered and then inserted into the green sheet assembly to be co-sintered to form the substrate support assembly. The porous plugs may have a porous portion, or the entire porous plug may be made porous. The porosity may vary from 10% to 90%. In some embodiments, the porosity of the porous plugs 432 may vary from 30% to 70%. In some embodiments, the porosity of the porous plugs 432 may vary from 40% to 60%. In some embodiments, the porous plugs may be formed from a different material than the puck plate and/or cooling plate. In some embodiments, the porous plugs may be formed from the same material as the puck plate and/or cooling plate. In some embodiments, the porous plugs may include the same material with different purities, the same material with different grain sizes, different ceramic materials with different purities, different ceramic materials with different grain sizes, or combinations thereof.

One or more electrical connections can be made to the functional elements in the puck plate to enable the application of voltage for electrostatic chucking. The substrate support assembly or electrostatic chuck may rely on the electrostatic forces generated by the patterned electrodes to hold the substrate or wafer in place without the use of physical clamps or vacuum systems. The substrate support assembly is able to support high temperature (e.g., greater than 150° C.) applications in embodiments. In some embodiments, the substrate support assembly is able to support cryogenic temperature (e.g., lesser than −150° C.) applications. The substrate support assembly enhances power dissipation for high temperature processes such as etching in embodiments. The substrate support assembly may be used in processes where high plasma power may be used (e.g., dielectric film etching) or where high surface temperatures may be needed to etch novel hard masks, for example. Additionally, since both the puck plate and the cooling plate are made of a dielectric material (e.g., having the same or nearly the same thermal coefficient of expansion), the disclosed substrate support assemblies may not degrade due to stress, fatigue, and/or creep that may result from thermal cycling.

Figure 6:
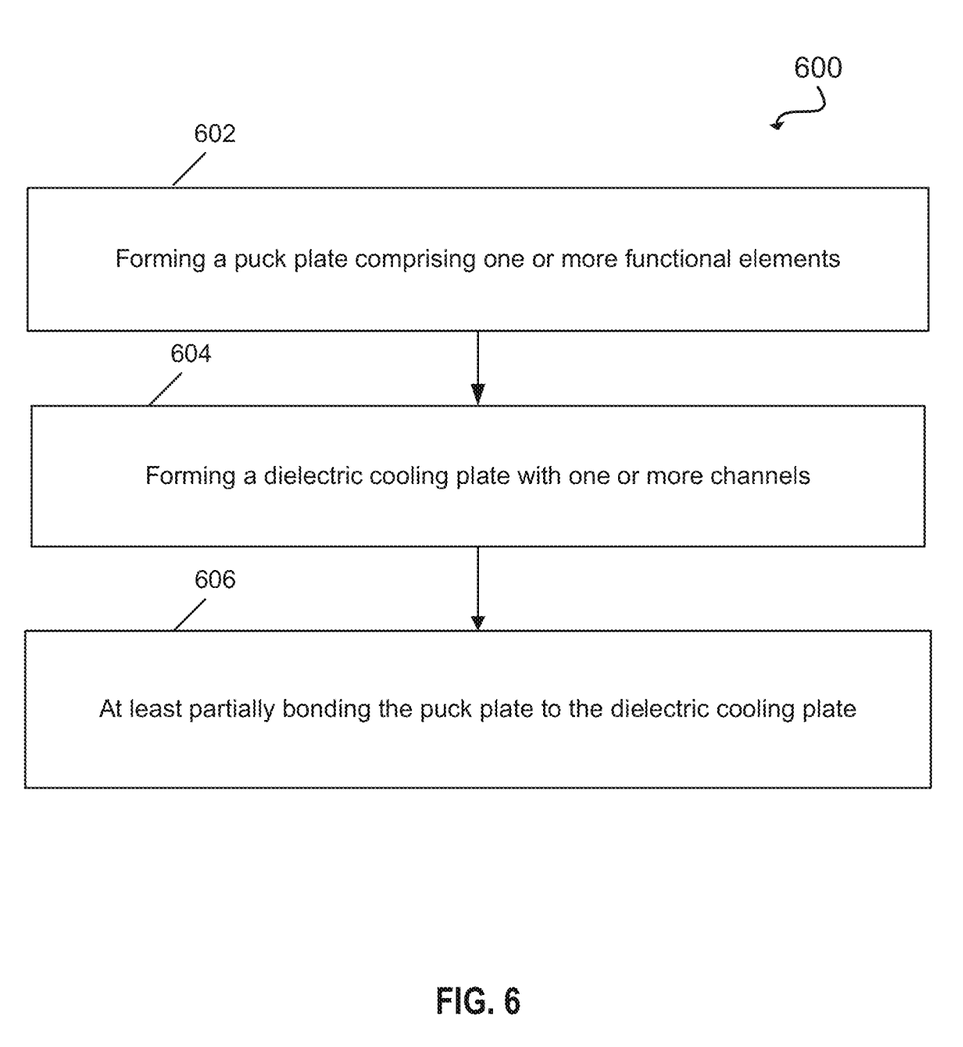
FIG. 6 illustrates one embodiment of a method of forming a substrate support assembly.

FIG. 6 illustrates example operations in a method 600 of forming a substrate support assembly, according to some embodiments. At block 602, method 600 involves forming a puck plate including one or more functional elements (e.g., 406-414). In one embodiment, a first green sheet (or stack of green sheets) may be formed for a puck plate (e.g., puck plate 402). At block 602, method 600 may involve creating the green sheet(s) from a ceramic material (e.g., $Al_2O_3$ or a similar material). The green sheet(s) may be formed by pressing and shaping a ceramic powder into a thin, flat sheet. The green sheet(s) may be processed to add specific patterns, features, and electrode layers using techniques like screen printing or laser machining. For example, at block 602, one or more functional elements (e.g., 406-414) may be embedded in the first green sheet(s). The green sheet(s) may then be sintered to form a puck plate (e.g., an electrostatic chuck).

At block 604, method 600 may involve forming a dielectric cooling plate with one or more channels. For example, a second green sheet (or stack of green sheets) may be formed for the cooling plate (e.g., cooling plate 404). The second green sheet(s) may be configured to include one or more cooling channels (e.g., channels 416) for a coolant (e.g., refrigerant) to flow therethrough. The second green sheet(s) may be further configured to include one or more gas channels (e.g., channels 418) for a gas (e.g., inert gas) to flow therethrough. The cooling channels and the gas channels may have any cross sectional shape such as a square, a rectangle, a circle, an oval, a fin shape, a computer generated shape, a porous shape, or combinations thereof. In some embodiments, a dimension of the cooling channels and/or the gas channels may be determined based on a thermal conductivity of the dielectric material forming the cooling plate. For example, if the thermal conductivity is low, the cooling plate may have larger cooling channels and/or the gas channels, and vice versa. In some embodiments, the cooling plate may further include one or more terminals, which may be used to connect one or more functional elements in puck plate to a power source. In some embodiments, the cooling plate further include one or more vias (e.g., vias 415) for the terminals to pass therethrough. In some embodiments, the cooling plate may include both the vias and the terminals to connect one or more functional elements in puck plate to a power source. The green sheet(s) may then be sintered to form a cooling plate.

At block 606, the puck plate and the dielectric cooling plate may be at least partially or fully bonded. For example, the puck plate may be bonded to the cooling plate using diffusion bonding, ceramic frit, or glass frit. In some embodiments, the puck plate and the cooling plate can be bonded using a bonding layer including Ni, Ti, C, Si, a flexible graphite layer, an organic elastomer, Al, In, Ni, Ti, and/or an alloy including Ni—Ti or Mo—Mg, or Cu—Ag or Al alloy. In some embodiments, the puck plate and the cooling plate may be bonded using another dielectric material (e.g., ceramic) as a bonding layer. Examples of materials that may be used in forming the puck plate, the cooling plate, and the bonding layer include niobium, aluminum oxide, aluminum nitride, single crystal alumina, or sapphire. In some embodiments, the substrate support assembly including the puck plate and the cooling plate may be formed using a hot press, a hot isostatic press, one or more green sheets, a gel cast, and/or a sol gel process, for example. Additionally, one or more electrical connections can be made to the functional elements in the puck plate to enable the application of voltage for electrostatic chucking.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A substrate support assembly, comprising:
   a first puck plate comprising one or more first functional elements; and
   a dielectric cooling plate bonded to the first puck plate, the dielectric cooling plate comprising:
   one or more first channels for a coolant to flow therethrough; and one or more second channels for a gas to flow therethrough.

2. The substrate support assembly of claim 1, wherein the first puck plate and the dielectric cooling plate comprise (i) a same ceramic material; (ii) different ceramic materials; (iii) the same ceramic material with different purities; (iv) the same ceramic material with different grain sizes; (v) different ceramic materials with different purities, or (vi) different ceramic materials with different grain sizes.

3. The substrate support assembly of claim 1, wherein the one or more first functional elements comprise at least one of a clamp electrode, a heating electrode, a zone heater, a pixelated heater, a radio frequency (RF) electrode, or a gas channel.

4. The substrate support assembly of claim 1, wherein the first puck plate and the dielectric cooling plate comprise at least one of niobium, aluminum oxide, aluminum nitride, single crystal alumina, sapphire, or nitrides, oxides, or oxynitrides of a metal or a semiconductor.

5. The substrate support assembly of claim 1, further comprising:
a bonding layer at least partially bonding the first puck plate to the cooling plate.

6. The substrate support assembly of claim 5, wherein the bonding layer comprising at least one of aluminum oxynitride, a nitride of a metal or a semiconductor, aluminum nitride, silicon nitride, yttrium oxyfluoride, flexible graphite, an organic elastomer, Al, In, Ni, Ti, or an alloy comprising Ni—Ti or Mo—Mg.

7. The substrate support assembly of claim 1, wherein the first puck plate further comprises:
a plurality of heating zones; and
a plurality of RF electrodes corresponding to the plurality of heating zones.

8. The substrate support assembly of claim 1, wherein the one or more second channels have a cross sectional shape selected from the group consisting of a square, a rectangle, a circle, an oval, a fin shape, a computer generated shape, or a porous shape.

9. The substrate support assembly of claim 1, wherein the dielectric cooling plate further comprises one or more terminals connecting the one or more first functional elements to a power source.

10. The substrate support assembly of claim 1, wherein the dielectric cooling plate comprises one or more vias to allow passage of one or more terminals connecting the one or more first functional elements to a power source.

11. The substrate support assembly of claim 1, wherein the first puck plate further comprises one or more porous plugs.

12. The substrate support assembly of claim 11, wherein the one or more porous plugs are connected to the one or more second channels to direct the gas towards a substrate.

13. The substrate support assembly of claim 1, wherein the dielectric cooling plate further comprises one or more porous plugs.

14. A method comprising:
forming one or more first greens sheet for a puck plate, the one or more first green sheets comprising one or more embedded first functional elements;
forming one or more second green sheets for a dielectric cooling plate, the one or more second green sheets comprising one or more first channels for a coolant to flow therethrough and one or more second channels for a gas to flow therethrough;
disposing the one or more first green sheets on the one or more second green sheets; and
at least partially co-sintering the one or more first green sheets and the one or more second green sheets to form a substrate support assembly comprising the puck plate bonded to the dielectric cooling plate.

15. The method of claim 14, wherein:
forming the one or more first green sheets comprises disposing the one or more first functional elements in the one or more first green sheets.

16. The method of claim 14, wherein the puck plate and the dielectric cooling plate comprise the (i) a same ceramic material; (ii) different ceramic materials; (iii) the same ceramic material with different purities; (iv) the same ceramic material with different grain sizes; (v) different ceramic materials with different purities, or (vi) different ceramic materials with different grain sizes.

17. The method of claim 14, further comprising:
determining a dimension of the one or more first channels based at least in part on a thermal conductivity of a dielectric material forming the dielectric cooling plate; and
forming the one or more second green sheets with the one or more first channels having the dimension.

18. The method of claim 14, further comprising:
forming the one or more second green sheets comprises forming one or more vias in the one or more second green sheets to allow passage of one or more terminals connecting the one or more first functional elements, through the dielectric cooling plate, to a power source.

19. The method of claim 14, further comprising:
inserting one or more porous plugs into the one or more first green sheets or the one or more second green sheets; and
co-sintering the one or more porous plugs with the one or more first green sheets or the one or more second green sheets to form the substrate support assembly.

20. A method comprising:
forming a puck plate comprising one or more functional elements;
forming a dielectric cooling plate with one or more channels; and
at least partially bonding the puck plate to the dielectric cooling plate.

21. The method of claim 20, wherein the at least partially bonding further comprises:
disposing a bonding layer between the puck plate and the dielectric cooling plate, and at least partially bonding the puck plate and the cooling plate.

22. The method of claim 20, wherein the at least partially bonding further comprises:
bonding the puck plate to the dielectric cooling plate using diffusion bonding, ceramic frit, or glass frit.

23. The method of claim 20, wherein the puck plate and the dielectric cooling plate comprise the (i) a same ceramic material; (ii) different ceramic materials; (iii) the same ceramic material with different purities; (iv) the same ceramic material with different grain sizes; (v) different ceramic materials with different purities, or (vi) different ceramic materials with different grain sizes.

24. The method of claim 20, wherein forming the dielectric cooling plate with the one or more channels further comprises:
forming, in a body of the dielectric cooling plate, one or more first channels for a coolant to flow therethrough; or
forming, in the body of the dielectric cooling plate, one or more second channels for a gas to flow therethrough.

25. The method of claim 20, wherein forming the dielectric cooling plate with the one or more channels further comprises:
- determining a dimension of one or more first channels or one or more second channels based at least in part on a thermal conductivity of a dielectric material forming the dielectric cooling plate; and
- forming the one or more first channels or the one or more second channels having the dimension.

26. The method of claim 20, wherein forming the dielectric cooling plate with the one or more channels further comprises:
- forming one or more vias in the dielectric cooling plate to allow passage of one or more terminals connecting the one or more functional elements to a power source.

* * * * *